United States Patent
Shiobara et al.

(10) Patent No.: US 7,147,920 B2
(45) Date of Patent: *Dec. 12, 2006

(54) WAFER DICING/DIE BONDING SHEET

(75) Inventors: Toshio Shiobara, Usui-gun (JP);
Nobuhiro Ichiroku, Usui-gun (JP);
Hideki Akiba, Usui-gun (JP);
Masachika Yoshino, Tokyo (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 418 days.

This patent is subject to a terminal disclaimer.

(21) Appl. No.: 10/713,163

(22) Filed: Nov. 17, 2003

(65) Prior Publication Data

US 2004/0105990 A1    Jun. 3, 2004

(30) Foreign Application Priority Data

Nov. 18, 2002   (JP)   ............... 2002-333149

(51) Int. Cl.
*B32B 27/38*   (2006.01)
*B32B 27/28*   (2006.01)
*C08L 63/00*   (2006.01)
*C08L 79/08*   (2006.01)
*C08L 83/10*   (2006.01)

(52) U.S. Cl. ............ 428/414; 428/413; 428/447; 428/448; 428/473.5; 525/476; 525/533; 525/928

(58) Field of Classification Search ............... None
See application file for complete search history.

(56) References Cited

U.S. PATENT DOCUMENTS

| 5,677,393 | A | | 10/1997 | Ohmori et al. | |
| 5,728,473 | A | * | 3/1998 | Inoue et al. | 428/448 |
| 6,268,033 | B1 | * | 7/2001 | Oka et al. | 428/40.1 |
| 6,645,632 | B1 | * | 11/2003 | Honda et al. | 428/413 |
| 6,949,619 | B1 | * | 9/2005 | Ichiroku et al. | 528/353 |
| 2001/0031828 | A1 | * | 10/2001 | Honda et al. | 525/107 |

FOREIGN PATENT DOCUMENTS

| JP | 9-67558 | 3/1997 |
| JP | 3221756 | 8/2001 |

* cited by examiner

*Primary Examiner*—Michael J. Feely
(74) *Attorney, Agent, or Firm*—Oblon, Spivak, McClelland, Maier & Neustadt, P.C.

(57) ABSTRACT

In a wafer dicing/die bonding sheet comprising a backing member, an adhesive layer, and a protective member, the adhesive layer is made of an adhesive composition comprising a phenolic hydroxyl radical-bearing polyimide resin, an epoxy resin, and an epoxy resin curing agent, the ratio of the total weight of the epoxy resin and the epoxy resin curing agent to the weight of the polyimide resin being from 0.1:1 to 3:1. Due to heat resistance, improved adhesive properties and a low modulus of elasticity, the wafer dicing/die bonding sheet is effective for reducing the warpage of a chip after die bonding.

8 Claims, No Drawings

WAFER DICING/DIE BONDING SHEET

BACKGROUND OF THE INVENTION

1. Field of the Invention

This invention relates to a wafer dicing/die bonding sheet for use in the dicing of silicon wafers and the bonding of chips to lead frames.

2. Background Art

In the prior art, semiconductor devices are generally manufactured by securing a large diameter silicon wafer to a dicing tape, dicing the wafer into semiconductor chips, peeling and removing the chips from the dicing tape, and bonding an individual chip to a lead frame with a curable liquid adhesive.

For simplifying the process and preventing contamination of semiconductor chips with fluid ingredient from the liquid adhesive, there is recently a need for a dicing/die bonding sheet in the form of a pressure-sensitive adhesive sheet that serves as both the pressure-sensitive adhesive layer of dicing tape and the die bonding agent. The dicing/die bonding sheet needs to develop an adhesive (or retentive) force to withstand the dicing operation and to adhere to the chip being taken away in the initial dicing step and needs to further develop a strong bond to the lead frame in the subsequent die bonding step.

JP-A 9-67558 discloses an adhesive for dicing/die bonding sheets comprising a polyimide resin. On account of a high glass transition temperature (Tg) and a high modulus of elasticity, the polyimide resins are insufficient to mitigate the thermal stress between bonded substrates of semiconductor parts. For reliability enhancement, there is a need for a dicing/die bonding sheet comprising an adhesive composition having a low modulus of elasticity enough for stress mitigation.

On the other hand, film adhesives using heat resistant polyimide resins have been proposed for use in die bonding or lead frame bonding. Most prior art polyimide base adhesives are thermoplastic and thus problematic in that they lose a bonding force at high temperatures as encountered when advanced lead-free solders are used. There is a desire to have a die bonding agent that has a low modulus of elasticity and does not lose a bonding force even at high temperatures during soldering or the like.

Japanese Patent No. 3,221,756 corresponding to U.S. Pat. No. 5,677,393 describes a heat resistant adhesive film comprising a polyimide silicone having phenolic hydroxyl radicals and an epoxy resin. Since phenolic hydroxyl radicals are present at sterically packed positions, their reaction with the epoxy resin is hindered, resulting in insufficient cured properties and insufficient bond strength at high temperatures.

SUMMARY OF THE INVENTION

An object of the present invention is to eliminate the above-described drawbacks and to provide a dicing/die bonding sheet using a heat resistant resin composition having improved adhesion, heat resistance and a low modulus of elasticity.

The present invention is directed to a wafer dicing/die bonding sheet comprising a backing member, an adhesive layer formed thereon, and a protective member for protecting the adhesive layer. It has been found that when the adhesive layer is made of an adhesive composition comprising a phenolic hydroxyl radical-bearing polyimide resin, an epoxy resin, and an epoxy resin curing agent, the resulting wafer dicing/die bonding sheet readily adheres to a wafer at room temperature or under heat and pressure, can be used as the dicing tape in the dicing step, is kept adhered to the rear side of a chip as a die bonding agent after the dicing step, and allows the chip to be directly bonded to a lead frame. Since this composition has improved heat resistance, adhesive properties and a low modulus of elasticity, the cured adhesive layer is effective for minimizing the warpage of the chip after die bonding, and substantially prevents the package from cracking and separating during solder reflow. The dicing/die bonding sheet improves the reliability of a semiconductor device fabricated using the same.

Accordingly, the present invention provides a wafer dicing/die bonding sheet comprising a backing member, an adhesive layer formed thereon, and a protective member for protecting the adhesive layer, wherein the adhesive layer is made of an adhesive composition comprising as essential components a phenolic hydroxyl radical-bearing polyimide resin, an epoxy resin, and an epoxy resin curing agent, the ratio of the total weight of the epoxy resin and the epoxy resin curing agent to the weight of the polyimide resin being from 0.1:1 to 3:1.

The preferred adhesive composition is a heat resistant polyimide resin composition comprising as essential components a polyimide resin having phenolic hydroxyl radicals in or at the ends of the polyimide skeleton, comprising recurring units of the structural formula (1) or (2) shown below, and prepared using a diamine or monoamine bearing an aromatic ring having an amino radical and another aromatic ring having a phenolic hydroxyl radical, an epoxy resin having at least two glycidyl radicals, and an epoxy resin curing agent.

DESCRIPTION OF THE PREFERRED EMBODIMENTS

The wafer dicing/die bonding sheet of the present invention includes a backing member, an adhesive layer formed thereon, and a protective member for protecting the adhesive layer. The adhesive layer is made of an adhesive composition comprising a phenolic hydroxyl radical-bearing polyimide resin, an epoxy resin, and an epoxy resin curing agent as essential components.

The polyimide resin used herein is preferably a polyimide resin having phenolic hydroxyl radicals in or at the ends of the polyimide skeleton, comprising recurring units of the structural formula (1) or (2) shown below, and prepared using a diamine or monoamine bearing an aromatic ring having an amino radical attached thereto and another aromatic ring having a phenolic hydroxyl radical attached thereto.

The structural formula (1):

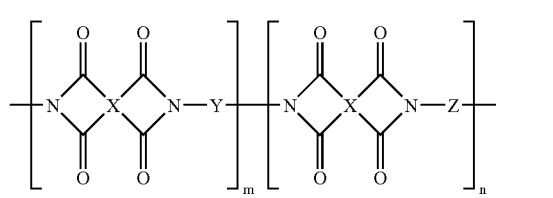

Herein X is at least one tetravalent organic radical as shown below, Y is a divalent organic radical comprising at least one diamine residue ($Y_1$) having a phenolic hydroxyl radical as shown below and at least one aromatic diamine residue ($Y_2$) as shown below, the molar ratio of $Y_1/(Y_1+Y_2)$ being from 0.01 to 1, Z is at least one siloxane diamine residue as shown below, m and n are natural numbers satisfying $0.1 \leq m/(m+n) \leq 0.99$ and $10 \leq m+n \leq 500$.
X =
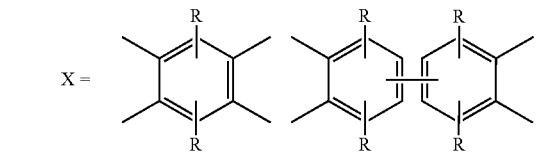
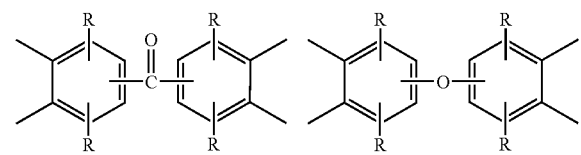
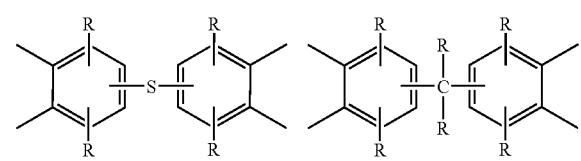
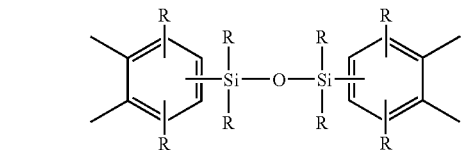
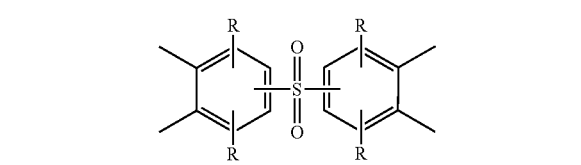
$Y_1$ =
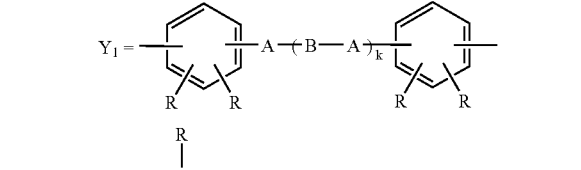
A =
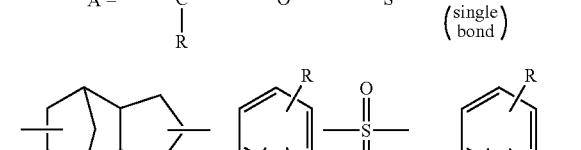
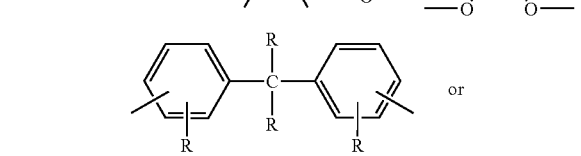
or
-continued
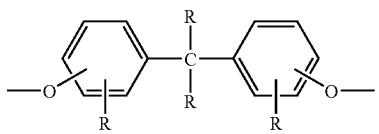
B =
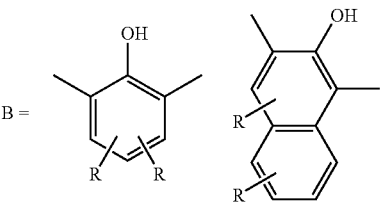
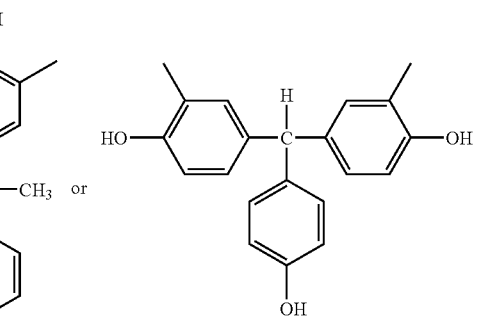
or
$Y_2$ =
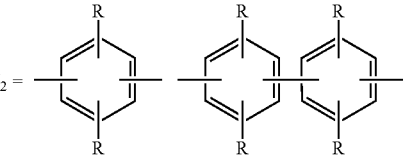
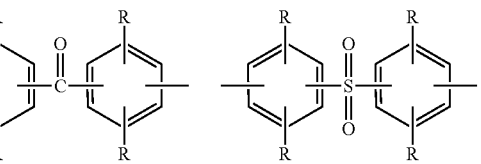
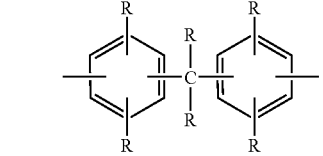
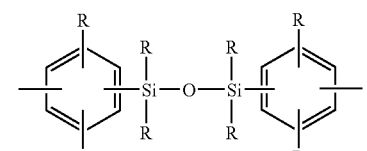
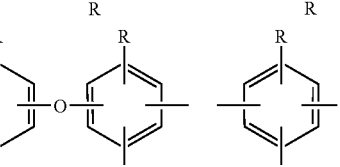
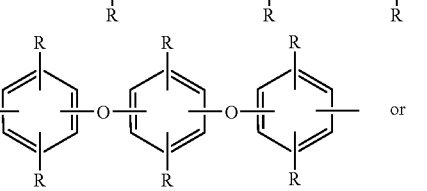
or -continued

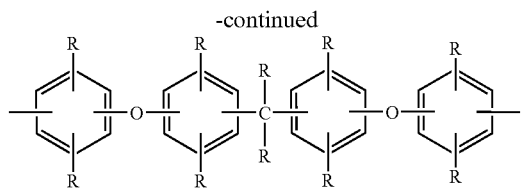

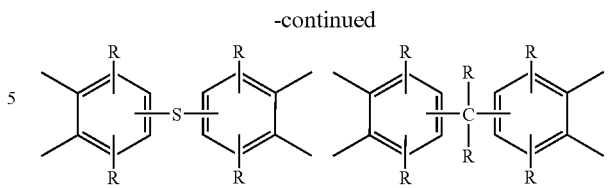

Herein k is a natural number of 1 to 5. R is each independently a hydrogen atom, a halogen atom such as fluorine, bromine or iodine, or a substituted or unsubstituted monovalent hydrocarbon radical having 1 to 8 carbon atoms, such as an alkyl, alkenyl, alkynyl, trifluoromethyl, or phenyl radical. All the substituent radicals attached to respective aromatic rings may be the same or different.

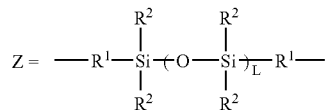

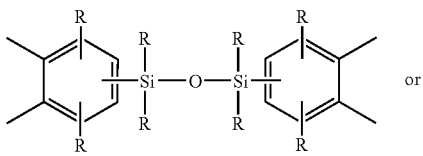

Herein $R^1$ is each independently an alkylene radical of 1 to 8 carbon atoms or an arylene radical such as phenylene. $R^2$ is each independently an alkyl or alkoxy radical of 1 to 8 carbon atoms which may be branched, or aryl radical such as phenyl. L is an integer of 4 to 60.

The structural formula (2):

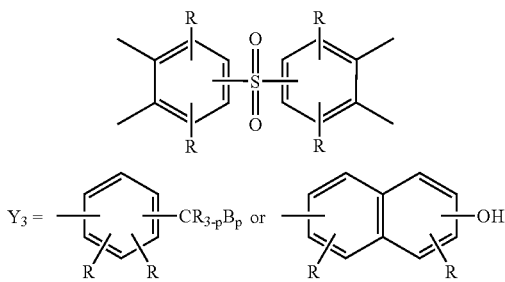

(2)

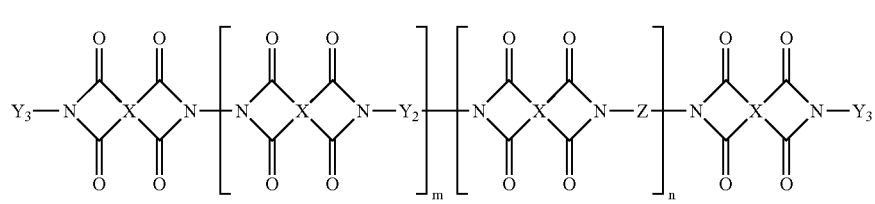

Herein X is at least one tetravalent organic radical as shown below, $Y_2$ is a divalent organic radical comprising at least one aromatic diamine residue as shown below, $Y_3$ is a monovalent organic radical comprising at least one aromatic amine residue having a phenolic hydroxyl radical as shown below, Z is at least one siloxane diamine residue as shown below, m and n are natural numbers satisfying $0.1 \leq m/(m+n) \leq 0.99$ and $10 \leq m+n \leq 500$.

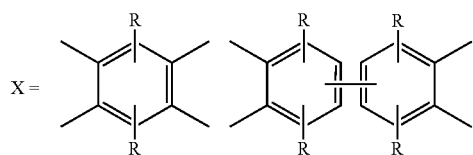

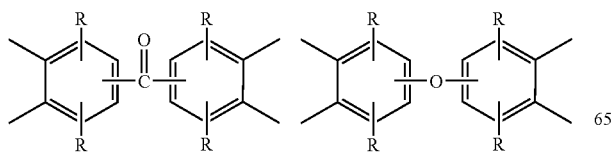

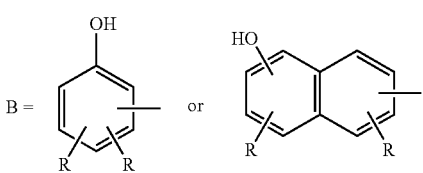

Herein p in $Y_3$ is a natural number of 1 to 3.

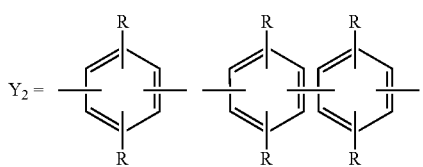

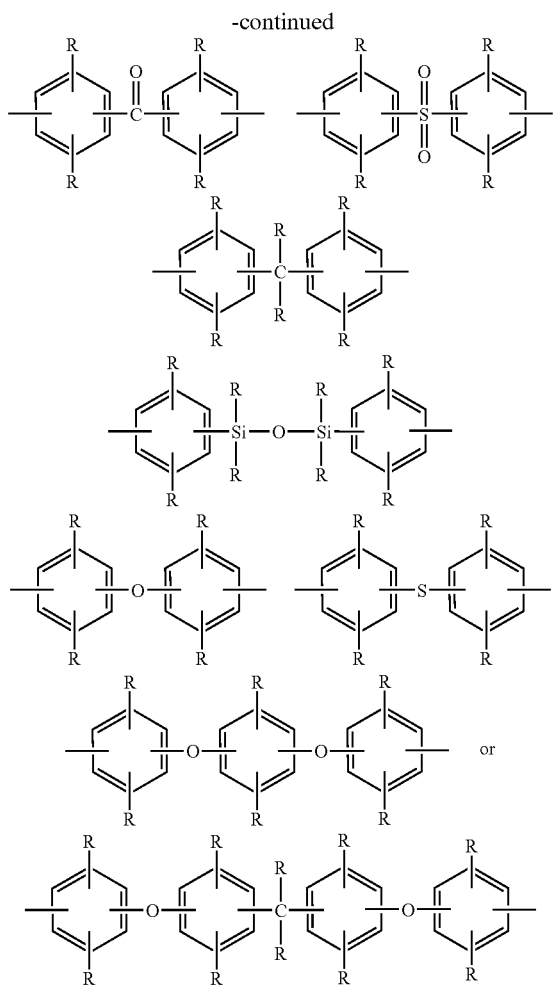

Herein R is each independently a hydrogen atom, a halogen atom such as fluorine, bromine or iodine or a substituted or unsubstituted monovalent hydrocarbon radical having 1 to 8 carbon atoms, such as an alkyl, alkenyl, alkynyl, trifluoromethyl, or phenyl radical. All the substituent radicals attached to respective aromatic rings may be the same or different.

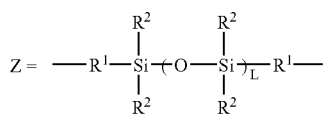

Herein $R^1$ is each independently an alkylene radical of 1 to 8 carbon atoms or arylene radical such as phenylene. $R^2$ is each independently an alkyl or alkoxy radical of 1 to 8 carbon atoms which may be branched or aryl radical such as phenyl. L is an integer of 4 to 60.

The polyimide resin having phenolic hydroxyl radicals in the polyimide skeleton is prepared by feeding a di- or polyfunctional amine component having a phenolic hydroxyl radical or a mixture of a di- or polyfunctional amine component having a phenolic hydroxyl radical and a di- or polyfunctional amine component free of a phenolic hydroxyl radical and a di- or polyfunctional acid anhydride component to a reactor, adding a solvent thereto, and heating. In a preferred procedure, the di- or polyfunctional amine component(s) is dissolved or dispersed in the solvent in the reactor, and the di- or polyfunctional acid anhydride component is dissolved or dispersed in the solvent, which is added dropwise to the reactor at low temperature with stirring, following which the reactor is heated.

The polyimide resin having phenolic hydroxyl radicals at the ends of the polyimide skeleton can be prepared by reacting a mixture of di- or polyfunctional amine components free of a phenolic hydroxyl radical with a di- or polyfunctional acid anhydride component in the same manner as above, but under the condition that the acid anhydride is in excess of the amine, for producing a polyamic acid having terminal functionality of acid anhydride, and further reacting the polyamic acid with a monoamine having a phenolic hydroxyl radical (i.e., monofunctional amine) for blocking the end with a phenolic hydroxyl radical-containing amine residue.

Preferred examples of the di- or polyfunctional acid anhydride component which can be used herein include, but are not limited to, tetracarboxylic acids such as pyromellitic acid, 3,3',4,4'-benzophenonetetracarboxylic acid, 2,3,3',4'-biphenyltetracarboxylic acid, bis(3,4-carboxyphenyl)sulfone, 3,3',4,4'-biphenyltetracarboxylic acid, bis[4-(3,4-dicarboxyphenoxy)phenyl]-methane, bis[4-(3,4-dicarboxyphenoxy)phenyl]-ethane, 2,2-bis[4-(3,4-dicarboxyphenoxy)phenyl]-propane, bis(3,4-dicarboxyphenyl)difluoromethane, 2,2-bis(3,4-dicarboxyphenyl)hexafluoropropane, 1,3-bis(3,4-dicarboxyphenyl)-1,1,3,3-tetramethylsiloxane, bis[4-(3,4-dicarboxyphenoxy)phenyl]methane, and bis(3,4-dicarboxyphenyl)ether, or reactive derivatives thereof such as dianhydrides and esters, and mixtures thereof.

Preferred examples of the di- or polyfunctional amine component (i) which can be used in the preparation of the inventive polyimide resin include, but are not limited to, aromatic diamines such as 4,4'-diaminodiphenylmethane, o-, m- or p-phenylenediamine, bis(4-(3-aminophenoxy)phenyl)sulfone, 2,4-diaminotoluene, 2,5-diaminotoluene, 2,4-diaminoxylene, 2,4-diaminodurene, dimethyl-4,4'-diaminodiphenyl, dialkyl-4,4'-diaminodiphenyls, dimethoxy-4,4'-diaminodiphenyl, diethoxy-4,4'-diaminodiphenyl, 4,4'-diaminodiphenyl ether, 3,4'-diaminodiphenyl ether, 4,4'-diaminodiphenylsulfone, 3,3'-diaminodiphenylsulfone, 4,4'-diaminobenzophenone, 3,3'-diaminobenzophenone, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, bis(4-(4-aminophenoxy)phenyl)sulfone, 2,2'-bis(4-(4-aminophenoxy)phenyl)propane, 2,2-bis(4-(4-aminophenoxy)phenyl)hexafluoropropane, 2,2-bis(4-(3-aminophenoxy)phenyl)propane, 2,2-bis(4-(3-aminophenoxy)phenyl)hexafluoropropane, 2,2-bis(4-(4-amino-2-trifluoromethylphenoxy)phenyl)hexafluoropropane, 2,2-bis(4-(3-amino-5-trifluoromethylphenoxy)phenyl)hexa-fluoropropane, 2,2-bis(4-aminophenyl)hexafluoropropane, 2,2-bis(3-aminophenyl)hexafluoropropane, 2,2-bis(3-amino-4-hydroxyphenyl)hexafluoropropane, 2,2-bis(3-amino-4-methylphenyl)hexafluoropropane, 4,4'-bis(4-aminophenoxy)octafluorobiphenyl, 2,2'-bis(trifluoromethyl)diaminodiphenyl, 3,5-diaminobenzotrifluoride, 2,5-diaminobenzotrifluoride, 3,3'-bistrifluoromethyl-4,4'-diaminobiphenyl, 3,3'-bistrifluoromethyl-5,5'-diaminobiphenyl, bis(trifluoromethyl)-4,4'-diaminodiphenyl, bis(fluorinated alkyl)-4,4'-diaminodiphenyls, dichloro-4,4'-diaminodiphenyl, dibromo-4,4'-diaminodiphenyl, bis(fluorinated alkoxy)-4,4'- diaminodiphenyls, diphenyl-4,4'-diaminodiphenyl, 4,4'-bis (4-aminotetrafluorophenoxy)tetrafluorobenzene, 4,4'-bis(4-aminotetrafluorophenoxy)octafluorobiphenyl, 4,4'-bisnaphthylamine, 4,4'-diaminobenzanilide, 4,4'-diamino (N-alkyl)benzanilides, alone or in admixture of any.

The amine component (ii) having a phenolic hydroxyl radical which can be used in the preparation of the inventive polyimide resin is preferably, but not limited to, a polyfunctional amine (ii)-1 having a phenolic hydroxyl radical as shown below.

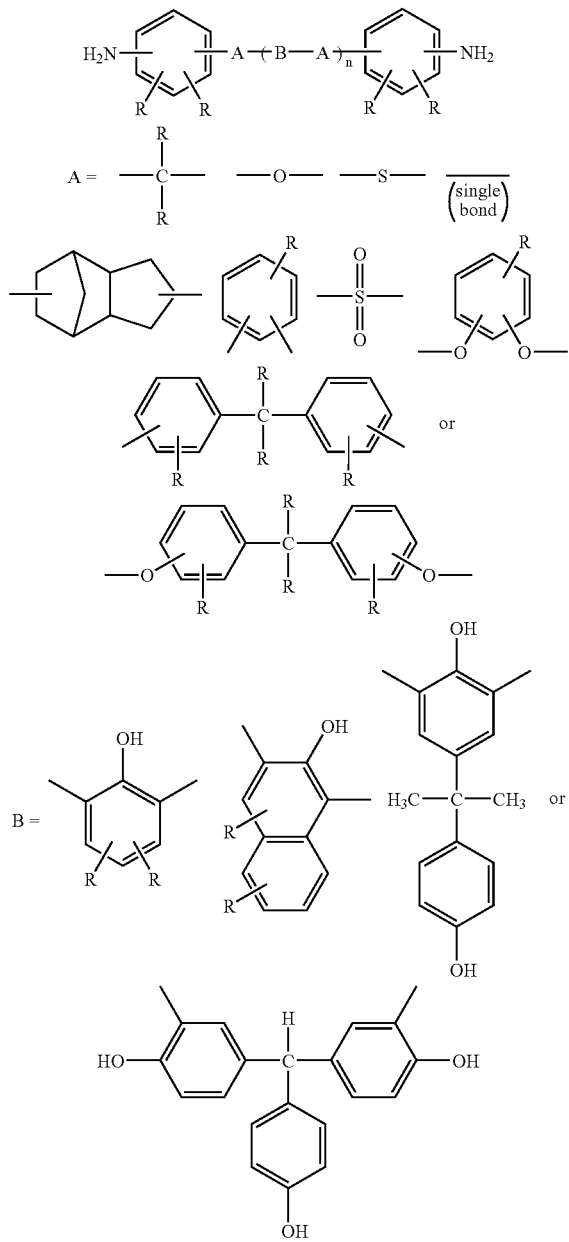

Herein, R is as defined above, and n is an integer of 1 to 10, preferably 1 to 5. Each of A and B may be any one or a mixture of two or more of the illustrated radicals.

Also useful is a monofunctional amine (ii)-2 having a phenolic hydroxyl radical, as shown by the following structure.

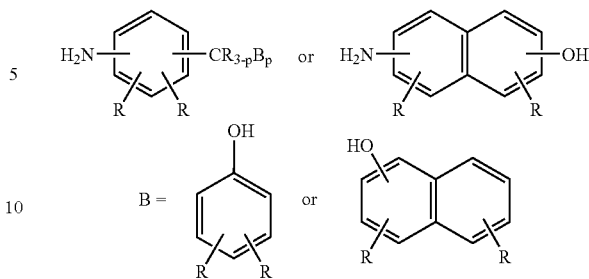

Herein, R is as defined above, and p is an integer of 1 to 3.

The above-described diamines may be used in admixture of two or more.

In the polyimide resin of the invention, a siloxane structure may be introduced in order to impart modulus, flexibility and solubility. The diaminosiloxane components (iii) used in the polyimide include siloxydiamines and diaminosiloxanes. Examples of suitable siloxydiamines include, but are not limited to, 1,3-bis(3-aminopropyl)-1,1,2,2-tetramethyldisiloxane, 1,3-bis(3-aminobutyl)-1,1,2,2-tetramethyldisiloxane, bis(4-aminophenoxy)dimethylsilane, and 1,3-bis(4-aminophenoxy)tetramethyldisiloxane. Suitable diaminosiloxanes are those of the following general formula:

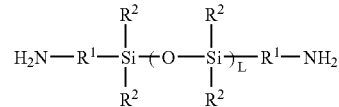

wherein $R^1$ and $R^2$ are as defined above, and L is an integer of 4 to 60.

In the preparation of the inventive polyimide resin, the total amount of acid anhydride components and the total amount of amine components are preferably in a molar ratio of from 1:0.8 to 1:1.2, more preferably from 1:0.95 to 1:1.05, even more preferably from 1:0.98 to 1:1.02, most preferably 1:1. Provided that P is the amount of di- or polyfunctional amine component (i) used, Q is the amount of a phenolic hydroxyl radical-containing amine component (ii) used (Q-1 is the amount of polyfunctional amine (ii)-1 used and Q-2 is the amount of monofunctional amine (ii)-2 used), and S is the amount of diaminosiloxane component (iii) used, the amine components are preferably used in such amounts that P is 0 to 80 mol %, especially 0 to 50 mol %, Q is 20 to 99 mol %, especially 30 to 90 mol % (Q-1 is 10 to 99 mol %, especially 20 to 99 mol % and Q-2 is 0 to 20 mol %, especially 0 to 10 mol %), and S is 1 to 90 mol %, especially 10 to 80 mol %, based on the total amount of amine components. Too low a proportion of di- or polyfunctional amine component (i) may lead to an increased water absorption whereas too high may lead to less substrate adhesion. Too low a proportion of phenolic hydroxyl radical-containing amine component (ii) may lead to less substrate adhesion whereas too high may lead to an increased modulus of elasticity and a loss of flexibility. Too low a proportion of diaminosiloxane component (iii) may achieve less flexibility-imparting effect whereas too high may lead to an increased moisture permeability and poor heat resistance.

A solvent may be used for reaction of acid anhydride with amine to take place. Suitable solvents are amide solvents commonly used as the solvent for polyimides and having a high dissolving power such as N-methylpyrrolidone, N,N-dimethylformamide and N,N-dimethylacetamide; and oxygen-containing solvents including lactones such as γ-butyrolactone, α-methyl-γ-butyrolactone, γ-valerolactone, δ-valerolactone, γ-caprolactone, and ε-caprolactone. Besides, carbonates such as ethylene carbonate and propylene carbonate; esters such as butyl acetate, ethyl cellosolve acetate, and butyl cellosolve acetate; ethers such as dibutyl ether, diethylene glycol dimethyl ether, and triethylene glycol dimethyl ether; ketones such as methyl isobutyl ketone, cyclohexanone, and acetophenone; alcohols such as butanol, octanol, and' ethyl cellosolve; chain-like or cyclic amide, urea, sulfoxide, sulfone, hydrocarbon, and halide solvents may be added as long as they have no negative impact on the stability of the polyimide composition.

The polyimide resin having an amino radical on an aromatic ring and a phenolic hydroxyl radical on another aromatic ring can be prepared by reacting a tetracarboxylic acid dianhydride with a diamine under such conditions that the phenolic hydroxyl radical-containing diamine is used in a diamine/tetracarboxylic acid dianhydride ratio<1. Where two or more diamines are reacted with a tetracarboxylic acid dianhydride, a phenolic hydroxyl radical-free diamine is first reacted with the tetracarboxylic acid dianhydride in the solvent described above, to form an amic acid oligomer. Since the molar ratio of acid anhydride to amine in the final polyimide resin is substantially 1:1, the amic acid oligomer which does not contain a phenolic hydroxyl radical-containing diamine is an oligomer which is rich in acid anhydride and terminated with an acid anhydride radical. Then the acid anhydride-terminated amic acid oligomer solution is added dropwise to a phenolic hydroxyl radical-containing diamine under such conditions that the diamine/acid anhydride ratio in proximity to a droplet of the solution being dropped may not exceed 1, thereby forming a phenolic hydroxyl radical-bearing polyamic acid as a precursor to the phenolic hydroxyl radical-bearing polyimide resin.

Subsequently, the polyamic acid solution is heated to a temperature in the range of 80 to 250° C., preferably 120 to 200° C., whereupon dehydrating ring-closure reaction takes place on the amide moiety of polyamic acid, yielding a polyimide resin solution. Alternatively, an acetic anhydride/pyridine mixture is added to the polyamic acid solution, which is heated at a temperature of about 50° C. for imidization.

Care is taken such that the diamine/acid anhydride ratio in the solution may not exceed 1, probably because when the phenolic hydroxyl radical-containing diamine is added dropwise under acid anhydride-rich conditions, esterification due to reaction of carboxylic acid with phenolic hydroxyl radicals takes place at the same time as amide formation due to reaction of carboxylic acid with amine, resulting in three-dimensional crosslinking and gelation. The gelled product has an ester bond structure and so it undergoes hydrolysis under hot humid conditions to decompose into lower molecular weights, causing a loss of humidity-resistant reliability.

To prevent the phenolic hydroxyl radical-containing and acid anhydride-terminated amic acid oligomer solution from esterification reaction, the amic acid oligomer is preferably converted to an acid anhydride-terminated imide oligomer through dehydrating ring-closure.

To prevent esterification reaction by the reaction of phenolic hydroxyl radicals with acid anhydride radicals, capping phenolic hydroxyl radicals with protective radicals is possible, but is not necessarily recommended in the industrial application because of an increased process expense and an increased cost of protective radical reactant.

In addition to the polyimide resin, the adhesive composition of the invention includes an epoxy resin having at least two glycidyl radicals on the molecule and a curing agent therefor.

The epoxy resin used herein is not critical as long as it has at least two glycidyl radicals on the molecule. Examples include glycidyl type (inclusive of methylglycidyl type) epoxy resins, for example, glycidyl ethers of phenols such as bisphenol A, bisphenol F, resorcinol, phenol novolac, and cresol novolac; glycidyl ethers of alcohols such as butane diol, polyethylene glycol, and polypropylene glycol; glycidyl esters of carboxylic acids such as phthalic acid, isophthalic acid and tetrahydrophthalic acid; derivatives of aniline and isocyanuric acid in which active hydrogen attached to the nitrogen atom is substituted with a glycidyl radical; alicyclic epoxy resins obtained by epoxidizing olefin bonds within the molecule, such as vinylcyclohexene diepoxide, 3,4-epoxycyclohexylmethyl-3,4-epoxycyclohexanecarboxylate, and 2-(3,4-epoxy)cyclohexyl-5,5-spiro(3,4-epoxy)cyclohexane-m-dioxane; glycidyl ethers of p-xylylene-modified phenolic resins, glycidyl ethers of m-xylylene/p-xylylene-modified phenolic resins, glycidyl ethers of terpene-modified phenolic resins, glycidyl ethers of dicyclopentadiene-modified phenolic resins, glycidyl ethers of cyclopentadiene-modified phenolic resins, glycidyl ethers of polycyclic aromatic ring-modified phenolic resins, glycidyl ethers of naphthalene ring-containing phenolic resins, and biphenyl type epoxy resins. These resins may be used alone or in admixture of two or more.

The epoxy resin-curing agent is not critical as long as it serves to cure the epoxy resin. For example, phenolic compounds, acid anhydrides and amine compounds are useful, with the phenolic compounds and amine compounds being preferred. Exemplary phenolic compounds include resins obtained by condensing or co-condensing a phenol such as phenol, cresol, xylenol, hydroquinone, resorcinol, catechol, bisphenol A or bisphenol F or a naphthol such as α-naphthol, β-naphthol or dihydroxynaphthalene, with an aldehyde such as formaldehyde, acetaldehyde, propionaldehyde, benzaldehyde or salicylaldehyde, in the presence of acidic catalysts; xylylene skeleton-bearing phenolic resins synthesized from phenols and dimethoxy-p-xylene or the like; phenolic resins having a dicyclopentadiene skeleton; phenolic resins having a cyclopentadiene skeleton; melamine-modified phenolic resins; terpene-modified phenolic resins; polycyclic aromatic-modified phenolic resins; and naphthol resins having a xylylene skeleton. These may be used alone or in admixture of two or more. Of amine compounds, tetramethyldiaminophenylmethane and tetraethyldiaminophenylmethane are useful for the storage stability reason or other.

The chemical equivalent ratio T/(U+V) of the epoxy resin T to the sum of the epoxy resin curing agent U and the polyimide resin V having phenolic hydroxyl radicals in its skeleton is preferably set in the range between 0.5 and 2.0, more preferably between 0.7 and 1.5, though not critical. Within this range, unreacted residues of the respective components can be minimized and the degradation with time of adhesive strength, water absorption and electrical properties can be retarded.

The amount of the phenolic hydroxyl radical-containing diamine used is preferably 20 to 99 mol %, more preferably 30 to 90 mol %, based on the entire diamine components. In the practice of the invention, curing reaction takes place utilizing the reaction of phenolic hydroxyl radicals with epoxy radicals. Too less crosslinking points with the epoxy resin are undesirable because adhesion and heat resistance become poor.

The compounding proportion of the polyimide resin having phenolic hydroxyl radicals in its skeleton, the epoxy resin and the epoxy resin curing agent may be determined as appropriate. In the inventive composition, curing reaction takes place utilizing the reaction of phenolic hydroxyl radicals with epoxy radicals. If too less epoxy radicals are available, adhesion to an adherend becomes insufficient. If too much epoxy radicals are available, the excess of epoxy resin increases the modulus of elasticity, which is inconvenient to form a flexible adhesive sheet. Therefore, the epoxy resin and the epoxy resin curing agent are used in a total amount of 10 to 300 parts by weight per 100 parts by weight of the polyimide resin (i.e., the ratio of the total weight of epoxy resin and epoxy resin curing agent to the weight of phenolic hydroxyl radical-bearing polyimide resin is from 0.1:1 to 3:1). The preferred total amount of epoxy resin and epoxy resin curing agent is 15 to 250 parts by weight, more preferably 15 to 200 parts by weight per 100 parts by weight of the polyimide resin. A total amount of less than 10 pbw fails to achieve sufficient crosslinking to provide adhesion whereas a total amount in excess of 300 pbw renders the adhesive layer hard and brittle. In this regard, the amount of the epoxy resin used is preferably 5 to 200 parts, more preferably 7 to 150 parts, most preferably 10 to 100 parts by weight per 100 parts by weight of the polyimide resin.

In the adhesive composition of the invention, a curing catalyst may be compounded. Useful epoxy resin curing catalysts are phosphorus catalysts and amine catalysts, thought not limited thereto. Suitable phosphorus catalysts include triphenylphosphine, triphenylphosphonium triphenylborate, tetraphenylphosphonium tetraphenylborate, and compounds of the following formula.

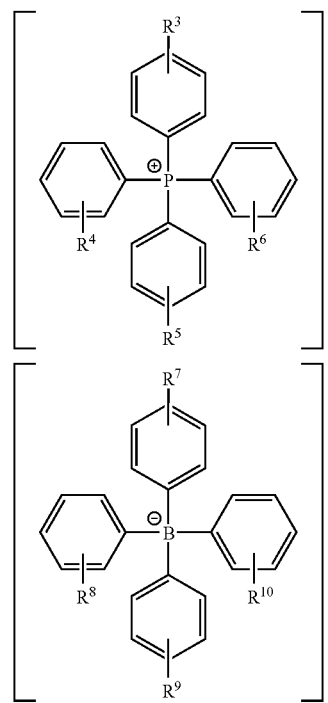

Herein $R^3$ to $R^{10}$ are selected from among hydrogen, halogen atoms (e.g., fluorine, bromine and iodine), and substituted or unsubstituted monovalent hydrocarbon radicals such as $C_{1-8}$ alkyl, alkenyl, alkynyl, $C_{1-8}$ alkoxy, trifluoromethyl and phenyl radicals. All these substituent radicals may be the same or different.

Suitable amine catalysts include imidazole derivatives such as 2-methylimidazole, 2-ethyl-4-methylimidazole, 1-cyanoethyl-2-methylimidazole and 2-phenyl-4,5-dihydroxymethylimidazole. The curing catalysts may be used alone or in admixture of any.

In order to improve the adhesion of the composition to silicon chips and lead frames, silane coupling agents may be used alone or in admixture of two or more. Suitable silane coupling agents are those having an alkoxysilyl radical and a reactive organic radical on the same molecule, such as 3-glycidoxypropyltrimethoxysilane, aminopropyltrimethoxysilane, 3-(methacryloxypropyl)trimethoxysilane, 2-(3,4-epoxycyclohexyl)ethyltrimethoxysilane, N-2-(aminoethyl)-3-aminopropyltrimethoxysilane, N-phenyl-3-aminopropyltrimethoxysilane, and 3-mercaptopropyltrimethoxysilane. The amount of the silane coupling agent added is 0.1 to 5 parts, preferably 0.5 to 3 parts by weight per 100 parts by weight of the polyimide resin and the epoxy resin curing agent combined. Less than 0.1 pbw of the silane coupling agent may fail to enhance the adhesion whereas the adhesion enhancement achieved with more than 5 pbw may not be so satisfactory relative to the cost.

The adhesive layer in the wafer dicing/die bonding sheet of the invention is formed of an adhesive composition comprising a phenolic hydroxyl radical-bearing polyimide resin, an epoxy resin, and an epoxy resin curing agent, as defined above. If desired, silicone-modified epoxy resins, silicone rubber powder or various thermoplastic resins may be added to the adhesive composition.

The heat resistant resin composition of the invention is desirably prepared by combining the above components and thoroughly mixing them for a time of at least 5 minutes in order to prevent separation of the components. The thus prepared resin composition is dissolvable in an aprotic polar solvent such as cyclohexanone or NMP and ready for use as varnish.

The wafer dicing/die bonding sheet of the invention has a backing member, an adhesive layer formed thereon from the above-described composition, and a protective member for protecting the adhesive layer. The wafer dicing/die bonding sheet may take any desired shape such as tape and precut sheet.

The backing member and the protective member are not particularly limited, and any film, especially plastic film may be used. For both the backing and protective members, use may be made of polyimide film, polyether imide film, polyaramide film, polyether ketone film, polyether ether ketone film, polyphenylene sulfide film, polyethylene terephthalate film, polybutylene terephthalate film, polyethylene naphthalate film or the like. A laminate of such films is also useful as the backing member and the protective member. A laminate of any of the above-described films with another film is also acceptable. Desirably the plastic films used as the backing member and the protective member are treated on one surface with a release agent so that the backing member and the protective member may be readily separated from the adhesive layer. Suitable release agents include silicone, fluoride, polyolefin, wax and alkyd base release agents, with the alkyd, silicone and fluoride base release agent being desired for heat resistance and ease of separation.

The backing and protective members generally have a thickness of about 10 to 300 μm, preferably about 16 to 100 μm, although the thickness varies with the material of which the members are made.

The wafer dicing/die bonding sheet of the invention is prepared by applying the adhesive composition onto a backing member, drying the coating to form the adhesive layer, and placing a protective member thereon. The adhesive layer generally has a thickness of about 1 to 50 μm, preferably about 10 to 20 μm.

From the working aspect, the peeling force between the adhesive layer and the backing member must differ from the peeling force between the adhesive layer and the protective member. Owing to this difference, once the protective member is peeled off, the adhesive layer is bondable to the surface of a silicon wafer by simple placement at room temperature (also referred to as pressure-sensitive bonding) or by placement under moderate heat and pressure, enabling dicing operation. At this point, the bonding force of the adhesive layer to the silicon wafer is preferably at least 100 g/25 mm, and more preferably at least 400 g/25 mm. The bonding force between the adhesive layer and the backing member in the wafer dicing/die bonding sheet should preferably be lower than the bonding force to the silicon wafer and typically less than 100 g/25 mm. This enables that the chips as diced are picked up while keeping the adhesive layer bonded thereto.

The IC chip with the adhesive layer bonded thereto is then mounted on a lead frame. The assembly is heated at a temperature of about 100 to 300° C., preferably about 150 to 250° C. and for a time of about 1 second to 60 minutes, preferably about 1 second to 1 minute. By this heating, the polyimide resin in the adhesive layer is cured whereby the IC chip is firmly bonded to the lead frame.

The use of the inventive die bonding sheet is not limited to the above-described procedure. For example, the inventive sheet can be used in the lamination of an organic substrate and a chip and the bonding to a ceramic substrate.

The wafer dicing/die bonding sheet of the invention has the advantages of heat resistance, adhesive properties and a low modulus of elasticity and has the additional effect of reducing the warpage of a chip after die bonding. The bonding sheet can form a cured adhesive layer that substantially prevents the package from cracking and separating upon solder reflow, eventually improving the reliability of the resulting semiconductor device.

EXAMPLE

Examples of the invention are given below by way of illustration and not by way of limitation. All parts are by weight. Mw is a weight average molecular weight, GPC is gel permeation chromatography, and Tg is a glass transition temperature.

Synthesis Example 1

A 1-liter separable flask equipped with a 25-ml water metering receiver coupled to a reflux condenser through a cock, a thermometer and a stirrer was charged with 44.03 parts of a diaminosiloxane (linear dimethylpolysiloxane blocked with a γ-aminopropyldimethylsiloxy radical at each end of the molecular chain, KF-8010 by Shin-Etsu Chemical Co., Ltd.) and 100 parts of cyclohexanone as a reaction solvent. By stirring at 80° C., the diaminosiloxane was dispersed. A solution of 38.72 parts of 6FDA (2,2-bis(3,4-dicarboxyphenyl)hexafluoropropane) as an acid anhydride in 100 parts of cyclohexanone was added dropwise to the dispersion. The solution was stirred for 8 hours at 80° C. for reaction, thereby synthesizing an acid anhydride-rich amic acid oligomer.

Next, a 1-liter separable flask equipped with a 25-ml water metering receiver coupled to a reflux condenser through a cock, a thermometer and a stirrer was charged with 17.25 parts of a phenolic hydroxyl radical-containing aromatic diamine (Diamine 1) shown below and 100 parts of cyclohexanone, which were dispersed. The acid anhydride-rich polyamic acid solution was added dropwise to the dispersion. Toluene, 25 ml, was then admitted, after which the temperature was elevated to about 160° C., at which reflux continued for 2 hours. It was confirmed that a predetermined amount of water collected in the water metering receiver and the outflow of water ceased. While the water metering receiver was freed of the effluent, the toluene was removed completely at 160° C. At the end of reaction, there was obtained 400 parts of a cyclohexanone solution of a polyimide resin having phenolic hydroxyl radicals in its skeleton. After the solvent was distilled off from the solution, vacuum drying yielded the polyimide resin.

Diamine 1

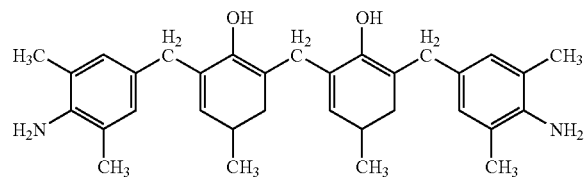

The infrared absorption spectrum of the polyimide resin was measured. The spectrum was free of an absorption peak attributable to polyamic acid and indicating the presence of unreacted functional radicals. Absorption peaks due to imide radicals were observed at 1780 cm$^{-1}$ and 1720 cm$^{-1}$. An absorption peak due to phenolic hydroxyl radicals was found at 3500 cm$^{-1}$. On GPC analysis using tetrahydrofuran as the solvent, the resin had a Mw of 30,000 (polystyrene basis). Tg was 115° C. on thermo-mechanical analysis.

Synthesis Example 2

In a flask equipped with a stirrer, thermometer and nitrogen purge line, 29.42 g (0.10 mol) of 3,3',4,4'-biphenyltetracarboxylic acid dianhydride, 7.46 g (0.03 mol) of 1,3-bis (3-aminopropyl)-1,1,3,3-tetramethyldisiloxane, and 28.73 g (0.07 mol) of 2,2-bis(4-(4-aminophenoxy)phenyl)propane in 196.8 g of N-methyl-2-pyrrolidone were reacted at room temperature for 12 hours, yielding a polyamic acid solution. Toluene, 30 g, was added to the polyamic acid solution, and reaction effected at 200° C. for 3 hours. It was confirmed that a predetermined amount of water collected in the water metering receiver and the outflow of water ceased. While the water metering receiver was freed of the effluent, the toluene was removed completely at 160° C., yielding a polyimide resin solution. At the end of reaction, the solvent was distilled off from the solution, and vacuum drying yielded the polyimide resin.

The infrared absorption spectrum of the polyimide resin was measured. The spectrum was free of an absorption peak attributable to polyamic acid and indicating the presence of unreacted functional radicals. Absorption peaks due to imide radicals were observed at 1780 cm$^{-1}$ and 1720 cm$^{-1}$. An absorption peak due to phenolic hydroxyl radicals was not found at 3500 cm$^{-1}$. On GPC analysis using tetrahydrofuran as the solvent, the resin had a Mw of 28,500 (polystyrene basis). Tg was 110° C. on thermo-mechanical analysis.

Example 1

In 600 parts of cyclohexanone were dissolved 100 parts of the polyimide resin obtained in Synthesis Example 1, 71.3 parts of o-cresol novolac epoxy resin EOCN1020 (by Nippon Kayaku Co., Ltd., epoxy equivalent 220 g/Eq), 27.7 parts of a phenol novolac resin TD2131 (Dainippon Ink & Chemicals, Inc., phenolic hydroxyl equivalent 110 g/Eq), 1 part of triphenylphosphine TPP (Hokko Chemical Co., Ltd.) as the curing catalyst and 1 part of 3-glycidoxypropyltrimethoxy-silane as the silane coupling agent. There was obtained an adhesive composition varnish.

Example 2

In 600 parts of cyclohexanone were dissolved 100 parts of the polyimide resin obtained in Synthesis Example 1, 71.3 parts of o-cresol novolac epoxy resin EOCN1020 (by Nippon Kayaku Co., Ltd., epoxy equivalent 220 g/Eq), 27.7 parts of a phenol novolac resin TD2131 (Dainippon Ink & Chemicals, Inc., phenolic hydroxyl equivalent 110 g/Eq), 1 part of triphenylphosphine TPP (Hokko Chemical Co., Ltd.) as the curing catalyst and 1 part of 3-mercaptopropyltrimethoxy-silane as the silane coupling agent. There was obtained a polyimide resin composition. To the composition were added 140 parts of silver powder and 50 parts of silicone rubber powder having an average particle size of 30 μm. Thorough agitation and mixing gave an adhesive composition varnish.

Comparative Example 1

In 600 parts of cyclohexanone were dissolved 100 parts of the polyimide resin obtained in Synthesis Example 2, 71.3 parts of o-cresol novolac epoxy resin EOCN1020 (by Nippon Kayaku Co., Ltd., epoxy equivalent 220 g/Eq), 27.7 parts of a phenol novolac resin TD2131 (Dainippon Ink & Chemicals, Inc., phenolic hydroxyl equivalent 110 g/Eq), 1 part of triphenylphosphine TPP (Hokko Chemical Co., Ltd.) as the curing catalyst and 1 part of 3-mercaptopropyltrimethoxy-silane as the silane coupling agent. There was obtained a polyimide resin composition. To the composition were added 140 parts of silver powder and 50 parts of silicone rubber powder having an average particle size of 30 μm. Thorough agitation and mixing gave an adhesive composition varnish.

Examples 3–7 and Comparative Examples 2–4

In 100 parts of the polyimide resin obtained in Synthesis Example 1, a bisphenol A type epoxy resin Epikote 828 (Japan Epoxy Resin Co., Ltd., epoxy equivalent 190 g/Eq), a naphthalene type epoxy resin HP4032 (Dainippon Ink & Chemicals, Inc., epoxy equivalent 150 g/Eq), an aralkyl phenol resin MEH7800 (Meiwa Chemical Co., Ltd., phenolic hydroxyl equivalent 175 g/Eq), tetraethyldiaminodiphenyl-methane C-300S (Nippon Kayaku Co., Ltd.), triphenylphosphine TPP (Hokko Chemical Co., Ltd.) or tetraphenylphosphonium tetraphenylborate TPP-K (Hokko Chemical Co., Ltd.) as the curing catalyst and 3-mercaptopropyltrimethoxysilane KBM803 (Shin-Etsu Chemical Co., Ltd.) as the silane coupling agent were compounded in the amounts shown in Table 1. These ingredients were dissolved in 600 parts of cyclohexanone, yielding a polyimide resin composition.

TABLE 1

| Ingredients (pbw) | Example 3 | Example 4 | Example 5 | Example 6 | Example 7 | Comparative Example 2 | Comparative Example 3 | Comparative Example 4 |
|---|---|---|---|---|---|---|---|---|
| Polyimide resin | 100 | 100 | 100 | 100 | 100 | 100 | 100 | 100 |
| Epikote 828 | 65 | 39 |  | 40 | 20 | 165 | 3 | 50 |
| HP4032 |  |  | 40 | 30 |  |  |  |  |
| MEH7800 | 60 |  |  | 47 | 71 | 151 | 2.5 |  |
| C-300S |  | 21 |  |  | 5 |  |  |  |
| TPP |  |  | 1 | 1.3 |  | 1.5 | 0.8 | 1 |
| TPP-K | 3 |  |  |  |  |  |  |  |
| KBM803 | 1.5 | 1.5 | 1 | 1.2 | 1 | 1.6 | 1 | 1 |

Preparation of Dicing/Die Bonding Sheet and Epoxy Resin Encapsulation

A wafer dicing/die bonding sheet was prepared as follows. Onto a polyethylene terephthalate film (50 μm thick) treated with silicone release agent, the varnish or polyimide resin composition obtained in each of Examples 1 to 7 and Comparative Examples 1 to 4 was applied and dried to form an adhesive layer of 30 μm thick. The surface of the adhesive layer was protected with a release sheet (30 μm thick) in the form of a polyethylene terephthalate film treated with release agent. There was obtained a dicing/die bonding sheet of three layer structure.

The release sheet was removed from the dicing/die bonding sheet, after which the adhesive layer was bonded to a silicon wafer of 6 inches diameter under heat (120° C.) and pressure. Thereafter, the silicon wafer was diced into chips sized 7 mm by 6 mm by a well-known technique. The chip was picked up and mounted on a lead frame (64 pins, QFP) by a die bonding technique. No problems occurred during the dicing, pickup and die bonding steps.

Degree of Chipping

The degree of chipping when the wafer was diced into the chip size was measured (length of chipping in chip cross section).

The lead frame was placed in a mold where an epoxy resin encapsulant (KMC284) was molded at a temperature of 175° C. and a pressure of 70 kg/cm$^2$ for 60 seconds, obtaining an epoxy resin-encapsulated package.

The thus molded package was post-cured at 175° C. for 4 hours. The package was allowed to stand for 168 hours in an environment of 85° C./85% RH. The package was then passed three times through an IR reflow furnace at 260° C. Thereafter, using a scanning ultrasonic flaw detector, the package was inspected for the presence of cracks and any separation at the chip surface. The results are shown in Tables 2 and 3.

Bonding Force to Silicon Wafer Rear Side

The bonding force between the adhesive layer and the silicon wafer was determined by applying the dicing sheet to the rear side of a silicon wafer heated at 120° C., applying a load of 1 kg for pressure bonding, then peeling the backing member from the adhesive layer, applying a commercial pressure-sensitive adhesive tape (Cellophane Tape) of 25 mm wide to the adhesive layer, finally peeling the Cellophane tape together with the adhesive layer from the silicon wafer at an angle of 180°, the stress needed for the final peeling being the bonding force. The results are shown in Tables 2 and 3.

Bond Strength to Alloy 42

The dicing sheet was cut to dimensions of 5 mm×5 mm. The section was peeled from the backing member and sandwiched between Alloy 42 pieces of 18 mm×18 mm. The sandwich was press bonded at 150° C. and 6 kgf/cm² for 1 minute. The press bonded laminate was subjected to consecutive heat treatments in a nitrogen stream at 80° C. for 1 hour, at 150° C. for 1 hour, and at 200° C. for 1 hour for curing the adhesive layer, obtaining a specimen for a bond strength test. The shear bond strength was measured using an autograph tensile tester (Shimadzu Mfg. Co., Ltd.) at a rate of 2.0 mm/min. The results are shown in Tables 2 and 3.

Post-PCT Bond Strength

The dicing sheet was cut to dimensions of 5 mm×5 mm. The section was peeled from the backing member and sandwiched between Alloy 42 pieces of 18 mm×18 mm. The sandwich was press bonded at 150° C. and 6 kgf/cm² for 1 minute. The press bonded laminate was subjected to consecutive heat treatments in a nitrogen stream at 80° C. for 1 hour, at 150° C. for 1 hour, and at 200° C. for 1 hour for curing the adhesive layer, obtaining a specimen for a bond strength test. The specimen was held for 24 hours under pressure cooker test (PCT) conditions before the shear bond strength was measured using an autograph tensile tester (Shimadzu Mfg. Co., Ltd.) at a rate of 2.0 mm/min. The results are shown in Tables 2 and 3.

TABLE 2

|  | Example | | Comparative |
|---|---|---|---|
|  | 1 | 2 | Example 1 |
| Bonding force to silicon wafer (g/25 mm) | 890 | 780 | 680 |
| Average degree of chipping (μm) | 8.5 | 9.1 | 9.7 |
| Bond strength (kg/cm²) | 12.5 | 9.8 | 5.4 |
| Post-PCT bond strength (kg/cm²) | 10.8 | 8.2 | 3.1 |
| Package crack failure* | 0/20 | 0/20 | 6/20 |

*Package crack failure is the number of internally and externally cracked packages per 20 packages.

TABLE 3

|  | Example | | | | Comparative Example | | | |
|---|---|---|---|---|---|---|---|---|
|  | 3 | 4 | 5 | 6 | 7 | 2 | 3 | 4 |
| Bonding force to silicon wafer (g/25 mm) | 790 | 920 | 860 | 700 | 680 | 450 | 180 | 700 |
| Average degree of chipping (μm) | 8.9 | 7.9 | 8.2 | 9.5 | 9.3 | 13.0 | 12.3 | 10.0 |
| Bond strength (kg/cm²) | 13.0 | 14.2 | 13.5 | 12.0 | 11.0 | 10.5 | 6.3 | 6.7 |
| Post-PCT bond strength (kg/cm²) | 11.2 | 13.0 | 11.6 | 10.8 | 10.5 | 5.8 | 2.5 | 3.0 |
| Package crack failure* | 0/20 | 0/20 | 0/20 | 1/20 | 0/20 | 20/20 | 15/20 | 20/20 |

*Package crack failure is the number of internally and externally cracked packages per 20 packages.

Japanese Patent Application No. 2002-333149 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A wafer dicing/die bonding sheet comprising a backing member, an adhesive layer on the backing member, and a protective member on the adhesive layer, said adhesive layer being made of an adhesive composition, wherein said adhesive composition is a heat resistant polyimide resin composition comprising a polyimide resin having phenolic hydroxyl radicals in or at the ends of the polyimide skeleton, comprising recurring units of the structural formula (1) or (2) shown below and prepared using a diamine or monoamine bearing an aromatic ring having an amino radical and another aromatic ring having a phenolic hydroxyl radical, an epoxy resin having at least two glycidyl radicals, and an epoxy resin curing agent, the structural formula (1) or (2) being:

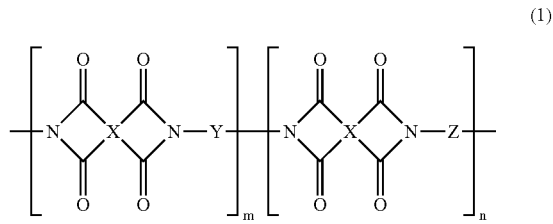

wherein X is at least one tetravalent organic radical as shown below, Y is a divalent organic radical comprising at least one diamine residue ($Y_1$) having a phenolic hydroxyl radical as shown below and at least one aromatic diamine residue ($Y_2$) as shown below, the molar ratio of $Y_1/(Y_1+Y_2)$ being from 0.01 to 1, Z is at least one siloxane diamine residue as shown below, m and n are natural numbers satisfying $0.1 \leq m/(m+n) \leq 0.99$ and $10 \leq m+n \leq 500$,

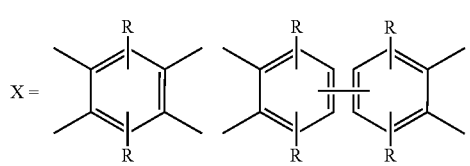

-continued
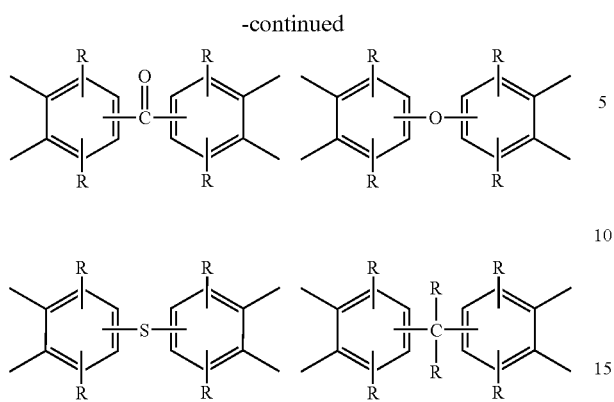
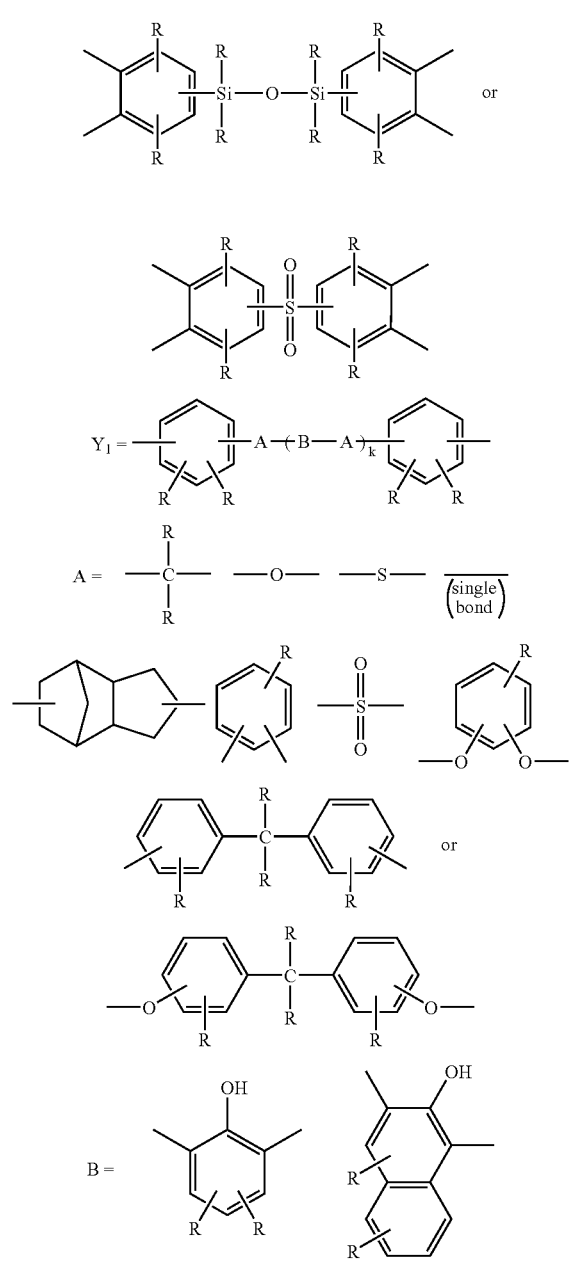
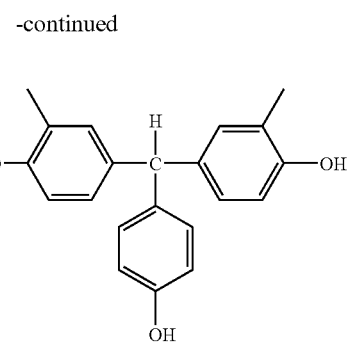
wherein k is a natural number of 1 to 5, R is each independently a hydrogen atom, a halogen atom or a substituted or unsubstituted monovalent hydrocarbon radical having 1 to 8 carbon atoms,

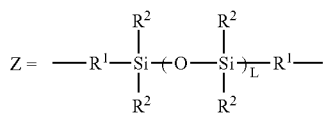
(5)

wherein $R^1$ is each independently an alkylene radical of 1 to 8 carbon atoms or arylene radical, $R^2$ is each independently an alkyl or alkoxy radical of 1 to 8 carbon atoms which may be branched, or aryl radical, and L is an integer of 4 to 60,

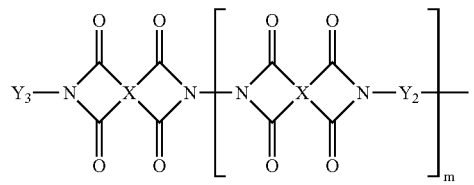
(2)

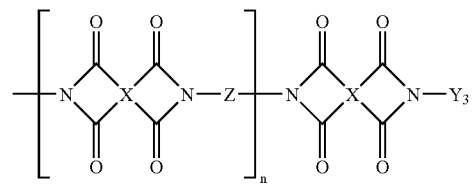

wherein X is at least one tetravalent organic radical as shown below, $Y_2$ is a divalent organic radical comprising at least one aromatic diamine residue as shown below, $Y_3$ is a monovalent organic radical comprising at least one aromatic amine residue having a phenolic hydroxyl radical as shown below, Z is at least one siloxane diamine residue as shown below, m and n are natural numbers satisfying $0.1 \leq m/(m+n) \leq 0.99$ and $10 \leq m+n \leq 500$,

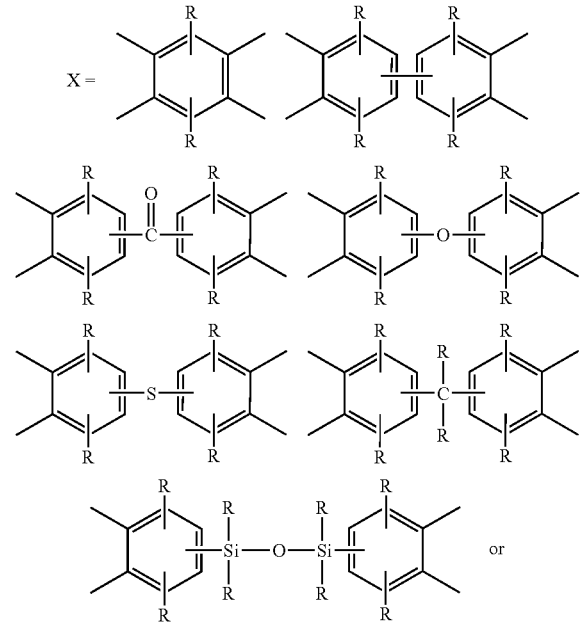

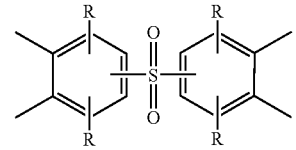

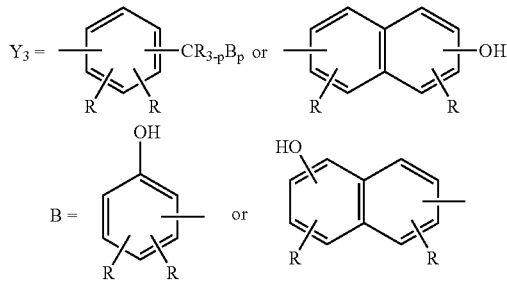

wherein p in $Y_3$ is a natural number of 1 to 3,

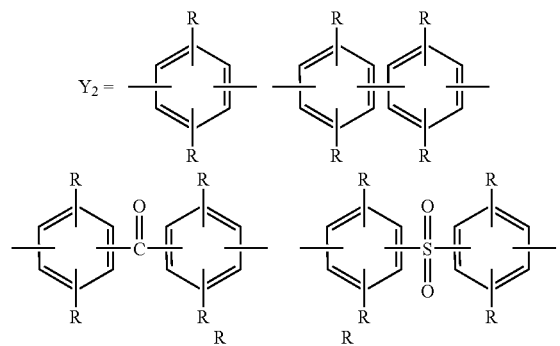

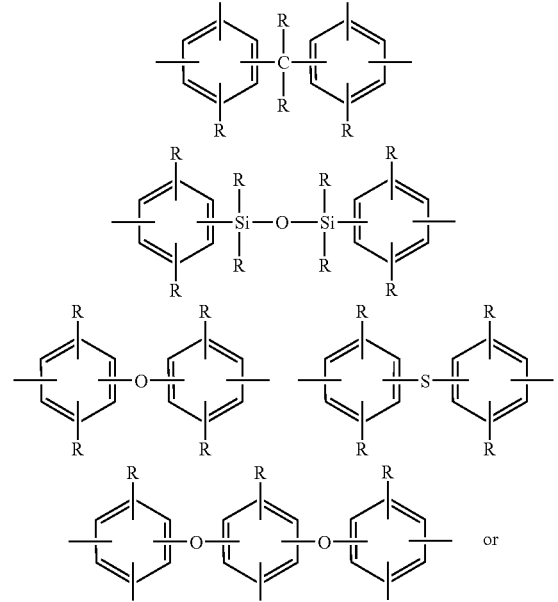

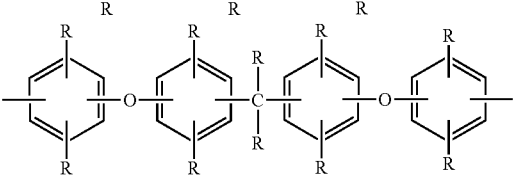

wherein R is each independently a hydrogen atom, a halogen atom or a substituted or unsubstituted monovalent hydrocarbon radical having 1 to 8 carbon atoms,

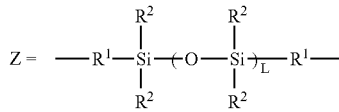

wherein $R^1$ is each independently an alkylene radical of 1 to 8 carbon atoms or arylene radical, $R^2$ is each independently an alkyl or alkoxy radical of 1 to 8 carbon atoms which may be branched or aryl radical, and L is an integer of 4 to 60.

2. The wafer dicing/die bonding sheet according to claim 1, wherein the ratio of the total weight of the epoxy resin and the epoxy resin curing agent to the weight of the polyimide resin being from 0.1:1 to 3:1.

3. The wafer dicing/die bonding sheet according to claim 1, wherein said adhesive composition further comprises a silane coupling agent.

4. The wafer dicing/die bonding sheet according to claim 3, wherein said adhesive composition comprises 0.1 to 5 parts by weight of the silane coupling agent per 100 parts by weight of the polyimide resin and the epoxy resin curing agent combined.

5. The wafer dicing/die bonding sheet according to claim 1, wherein said adhesive composition further comprises a curing catalyst selected from the group consisting of phosphorus catalysts and amine catalysts.

6. The wafer dicing/die bonding sheet according to claim 1, wherein the backing member and the protective member each has a thickness in a range of from 10 to 300 μm.

7. The wafer dicing/die bonding sheet according to claim 1, wherein the adhesive layer has a thickness in a range of from 1 to 50 μm.

8. A method of making a wafer dicing/die bonding sheet, the method comprising
applying an adhesive composition onto a backing member;
drying the adhesive composition to form an adhesive layer;
placing a protective member on the adhesive layer; and
producing the wafer dicing/die bonding sheet of claim 1.

* * * * *